US012593640B2

(12) United States Patent
Kim et al.

(10) Patent No.: US 12,593,640 B2
(45) Date of Patent: Mar. 31, 2026

(54) SEMICONDUCTOR WAFER PROCESSING DEVICE

(71) Applicant: Samsung Electronics Co., Ltd., Suwon-si (KR)

(72) Inventors: Min Joon Kim, Gwangmyeong-si (KR); Jin Seok Lee, Seoul (KR); Bong Ju Lee, Hwaseong-si (KR); Tae Jong Yu, Hwaseong-si (KR); Tae Sun Shin, Hwaseong-si (KR); Sung Il Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 611 days.

(21) Appl. No.: 17/745,254

(22) Filed: May 16, 2022

(65) Prior Publication Data

US 2022/0392781 A1 Dec. 8, 2022

(30) Foreign Application Priority Data

Jun. 3, 2021 (KR) ........................ 10-2021-0071978

(51) Int. Cl.
*C23C 16/455* (2006.01)
*H01L 21/67* (2006.01)

(52) U.S. Cl.
CPC .. *H01L 21/67017* (2013.01); *C23C 16/45565* (2013.01)

(58) Field of Classification Search
CPC .............................................. C23C 16/45565
See application file for complete search history.

(56) References Cited

U.S. PATENT DOCUMENTS

| 5,552,017 | A | 9/1996 | Jang et al. |
| 6,059,885 | A | * | 5/2000 | Ohashi | .............. C23C 16/45574 |
| | | | | | 118/730 |
| 10,041,172 | B2 | 8/2018 | Kim et al. |
| 10,145,012 | B2 | 12/2018 | Je et al. |
| 10,876,208 | B2 | 12/2020 | Chang et al. |
| 2009/0095222 | A1 | 4/2009 | Tam et al. |

(Continued)

FOREIGN PATENT DOCUMENTS

| KR | 2004-0070595 | A | 8/2004 |
| KR | 101505948 | B1 | 3/2015 |
| KR | 101696252 | B1 | * | 1/2017 | ........ H01L 21/67011 |

*Primary Examiner* — Aiden Lee

(74) *Attorney, Agent, or Firm* — Harness, Dickey & Pierce, P.L.C.

(57) ABSTRACT

There is provided a semiconductor device capable of improving the performance and reliability of a device. The semiconductor wafer processing device comprising a chamber, and, a showerhead configured to supply a gas into the chamber, wherein the showerhead includes, a plate, a plurality of first spray hole groups in a first row from a center of the plate, and a second spray hole group in a second row outside the first row, wherein each of the first spray hole groups includes a plurality of first spray holes, and when L is an average value of distances from the center of the plate to each spray hole of each of the first spray hole groups, the number of first spray holes where a distance from the center of the plate is smaller than L is more than the number of first spray holes where the distance from the center of the plate is greater than L.

10 Claims, 14 Drawing Sheets

(56) References Cited

U.S. PATENT DOCUMENTS

| | | | |
|---|---|---|---|
| 2016/0005572 A1* | 1/2016 | Liang ........................ | B05B 1/18 |
| | | | 156/345.33 |
| 2017/0207077 A1 | 7/2017 | Nagorny et al. | |
| 2018/0114677 A1* | 4/2018 | Komatsu .......... | H01J 37/32192 |
| 2019/0177846 A1 | 6/2019 | Batzer et al. | |
| 2021/0032752 A1* | 2/2021 | Noorbakhsh ..... | C23C 16/45565 |
| 2023/0243034 A1* | 8/2023 | Mankidy .......... | C23C 16/45565 |
| | | | 137/861 |

* cited by examiner

SEMICONDUCTOR WAFER PROCESSING DEVICE

This application claims priority from Korean Patent Application No. 10-2021-0071978 filed on Jun. 3, 2021 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a semiconductor wafer processing device.

2. Description of the Related Art

In general, a semiconductor element is manufactured through a plurality of unit processes including a wafer thin film deposition process and a wafer etching process. Among the processes, the etching process is performed by spraying a gas on a semiconductor wafer through a showerhead within a chamber blocked from the outside. Since the surface of the semiconductor wafer should be precisely processed up to a very small unit, the gas should be uniformly sprayed from the showerhead to the semiconductor wafer in the process of performing the semiconductor wafer processing process inside the chamber.

SUMMARY

However, the degree of gas spray may not be uniform depending on the position on the semiconductor wafer due to factors such as an asymmetric structure of the chamber used in the process or an asymmetric structure of a gas pipe connected to the showerhead. This may adversely affects the process uniformity of the semiconductor wafer. Therefore, example embodiments may provide a showerhead capable of more uniformly supplying a gas so that the semiconductor wafer may be more uniformly processed as a whole.

Aspects of the present disclosure provide a semiconductor wafer processing device that allows a gas to be more uniformly sprayed on a wafer. The objects of the present disclosure are not limited to the above-described objects, and other objects of the present disclosure not mentioned will be clearly understood by those skilled in the art from the following descriptions.

According to an aspect of the present disclosure, there is provided a semiconductor wafer processing device comprising a chamber, and, a showerhead configured to supply a gas into the chamber, wherein the showerhead includes, a plate, a plurality of first spray hole groups in a first row from a center of the plate, and a second spray hole group in a second row outside the first row, wherein each of the first spray hole groups includes a plurality of first spray holes, and when L is an average value of distances from the center of the plate to each spray hole of each of the first spray hole groups, the number of first spray holes where a distance from the center of the plate is smaller than L is more than the number of first spray holes where the distance from the center of the plate is greater than L.

According to another aspect of the present disclosure, there is provided a semiconductor wafer processing device comprising a chamber, and a showerhead configured to supply a gas into the chamber, wherein the showerhead includes, a plate a plurality of first spray hole groups in a first row from a center of the plate, and a plurality of second spray hole groups in a second row outside the first row, wherein each of the first spray hole groups includes a plurality of spray holes, and the number of spray holes positioned at a first distance from the center of the plate is more than the number of spray holes positioned at a second distance farther than the first distance, and each of the second spray hole groups includes a plurality of spray holes, and the number of spray holes positioned at a third distance from the center of the plate is less than the number of spray holes positioned at a fourth distance farther than the third distance.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF EXAMPLE EMBODIMENTS

Hereinafter, example embodiments according to the technical spirit of the present disclosure will be described with reference to the accompanying drawings.

Figure 1:
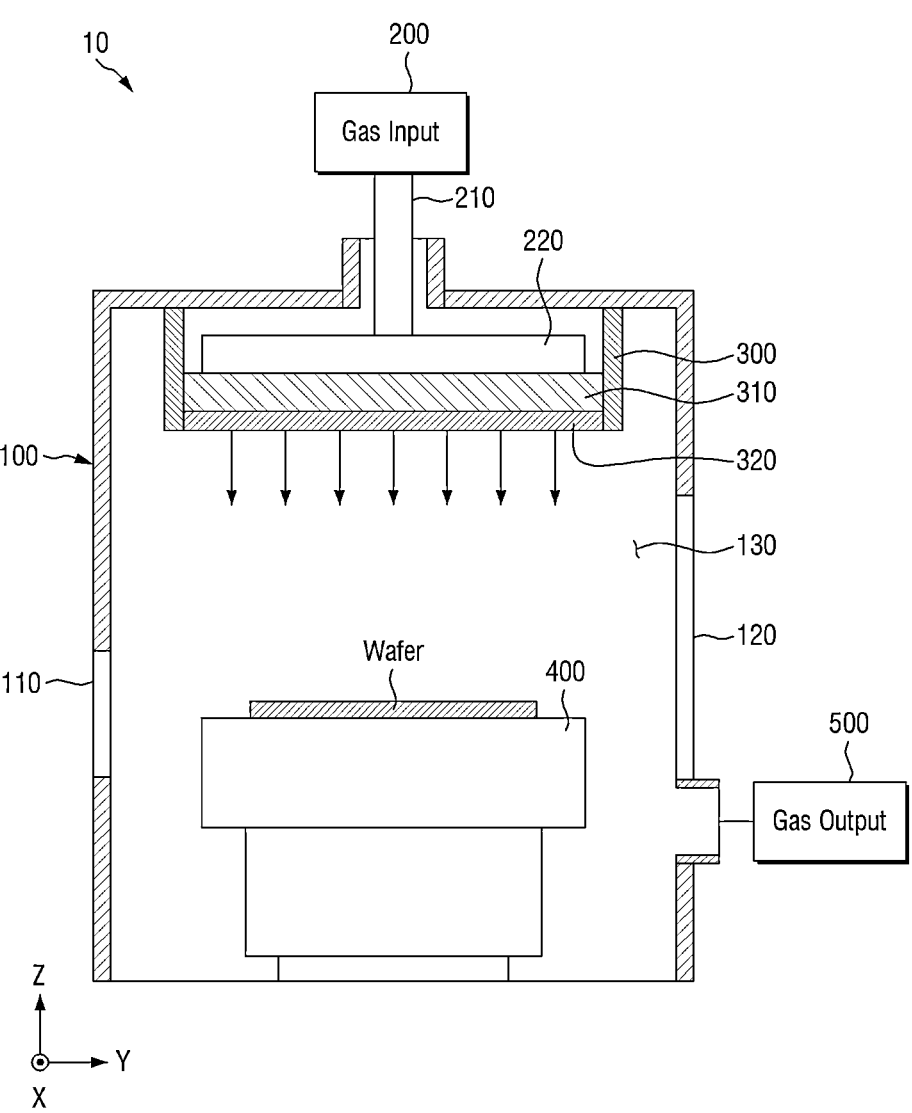
FIG. 1 is a view for describing a semiconductor wafer processing device according to example embodiments of the present disclosure.

FIG. 1 is a view for describing a semiconductor wafer processing device according to example embodiments of the present disclosure.

Referring to FIG. 1, a semiconductor wafer processing device 10 may include a chamber 100, a gas input 200 configured to supply a gas into the chamber, a showerhead 300 configured to spray the gas supplied from the gas input 200, a wafer support 400, and/or a gas output 500.

The chamber 100 may include a wafer inlet 110, a cantilever 120, and/or an internal space 130, which are installed in the chamber 100. The chamber 100 may maintain the internal space 130 in a sealed state or a vacuum state in a semiconductor wafer processing process through a pump (not shown). The wafer inlet 110 may be installed on one side wall of the chamber 100 to input the semiconductor wafer into the internal space 130. The cantilever 120 may fix various devices inside the chamber 100. The cantilever 120 may be installed on a wall opposite to the wafer inlet 110. The gas input 200 may include a gas supply pipe 210 and/or a gas branch pipe 220 connected to the gas supply pipe 210. The showerhead 300 may include a supply plate 310 and/or a plate 320. Structures of the gas input 200 and the showerhead 300 will be described later. The wafer support 400 may fix the wafer so that a position of the wafer may be constantly maintained in the process of processing the wafer inside the chamber 100. The gas output 500 may discharge the gas injected into the chamber 100 through the showerhead 300 to the outside of the chamber.

Figure 2:
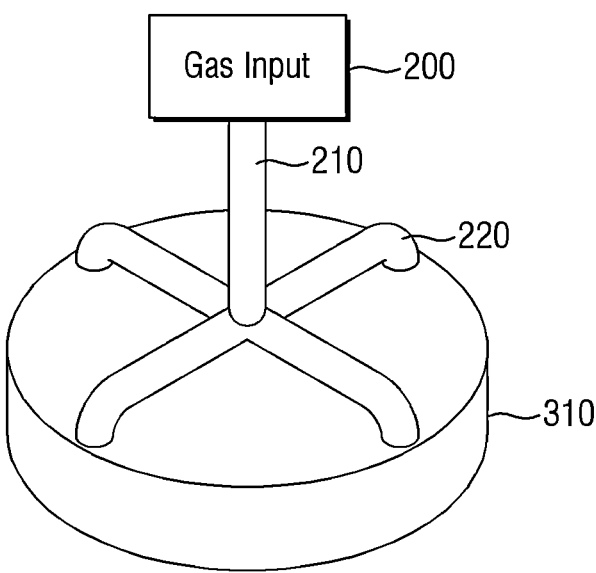
FIG. 2 is a view for describing the gas input of FIG. 1.
Figure 3:
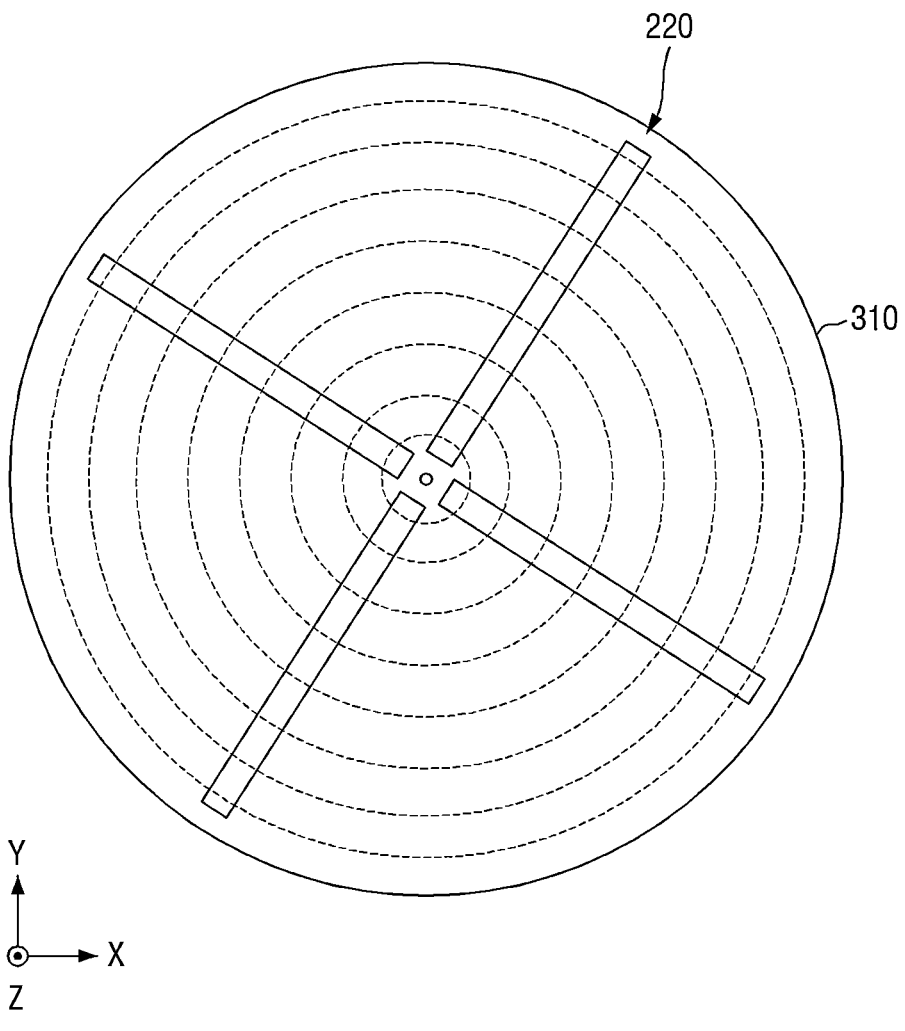
FIG. 3 is a view specifically showing the gas branch pipe of the gas input of FIG. 1.

FIG. 2 is a view for describing the gas input of FIG. 1. FIG. 3 is a view specifically showing the gas branch pipe of the gas input of FIG. 1.

Referring to FIG. 2, the gas input 200 may store the gas provided from the outside to inject the gas into the internal space 130 of the chamber through the gas supply pipe 210. The gas branch pipe 220 may be formed in a branch shape with several branches so that the gas provided from the gas supply pipe 210 may be sprayed over a wide area. For example, the gas branch pipe 220 may be installed in a cross-shaped branch shape on the supply plate 310 as shown in FIG. 2. The gas branch pipe 220 may include a plurality of holes connected to the supply plate 310 in order to provide the gas to the supply plate 310. For example, when the gas branch pipe 220 has the cross-shaped branch shape as shown in FIG. 2, the gas may be supplied to the supply plate 310 below the gas branch pipe 220 through the hole positioned at the end of the cross shape of the gas branch pipe 220. The gas branch pipe 220 may also be positioned above the supply plate 310 as shown in FIG. 2, and may also have a structure that is packaged together with the supply plate 310.

FIG. 3 is a view showing a structure of the gas branch pipe 220 from another angle.

Referring to FIG. 3, the gas branch pipe 220 may have a cross-shaped branch shape extending in a direction parallel to the supply plate 310. Each branch of the gas branch pipe 220 is formed with a hole (not shown), and may be connected to each of the supply pipes of the supply plate 310. Although FIG. 3 shows that the gas branch pipe 220 has the cross shape, example embodiments are not limited thereto and each branch may have a shape extending to the edge in various directions, including two directions or three directions from the center of the supply plate 310.

Next, a structure of the showerhead 300 of FIG. 1 will be described with reference to FIGS. 4 to 6.

Figure 4:
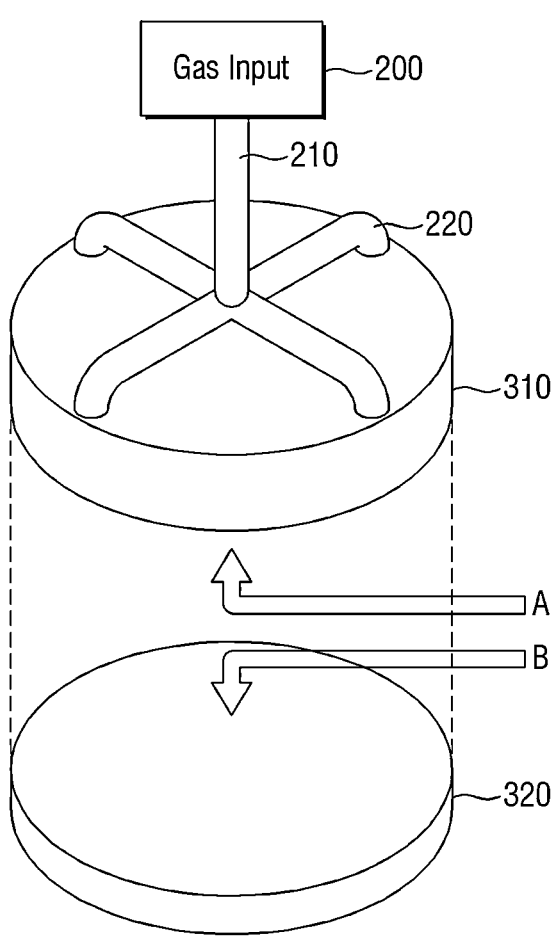
FIG. 4 is a view for describing a stacked structure of the showerhead of FIG. 1.

FIG. 4 is a view for describing a stacked structure of the showerhead 300 of FIG. 1. FIG. 5 is a view showing the supply plate 310 from a direction A of FIG. 4. FIG. 6 is a view showing the plate 320 from a direction B of FIG. 4.

First, referring to FIG. 4, the showerhead 300 may include the supply plate 310 and/or the plate 320. An upper portion of the supply plate 310 may be connected to the gas branch pipe 220, and a lower portion of the supply plate 310 may be connected to the plate 320. The plate 320 may be formed to be parallel to the supply plate 310. Referring to FIGS. 5 and 6, the supply plate 310 may include a supply plate center

311, a fastening hole (not shown), an alignment hole (not shown), and/or supply holes 312, and a supply pipe (not shown), and the plate 320 may include a plate center 321, a fastening hole (not shown), an alignment hole (not shown), and/or spray hole groups 322. The supply plate center 311 and the plate center 321 may correspond to the center of each circle when the supply plate 310 and the plate 320 have circular shapes. When the supply plate 310 and the plate 320 are coupled, the supply plate center 311 may correspond to the plate center 321, and the fastening hole (not shown) may be formed so that the plate 320 may be fixed to the supply plate 310 corresponding to each fastening hole (not shown) of the plate 320. Likewise, the alignment hole (not shown) may be formed so that the plate 320 may be accurately fixed to the supply plate 310 corresponding to each alignment hole (not shown) of the plate 320. The fastening hole (not shown) and the alignment hole (not shown) may have, for example, a structure that may be fixed through a bolt.

Figure 5:
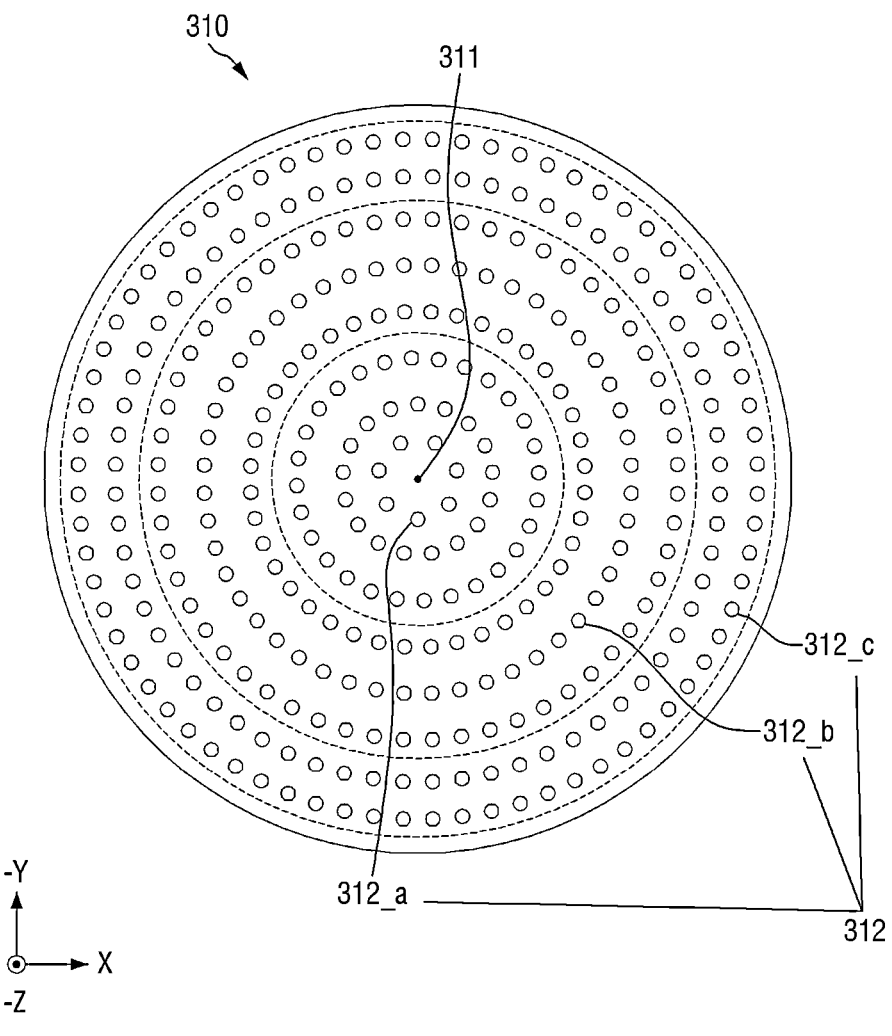
FIG. 5 is a view showing the supply plate from a direction A of FIG. 4.

Referring to FIGS. 3 and 5, the supply holes 312 may be formed in a plurality of rows on a lower portion of the supply pipe 318 arranged along a virtual concentric circle with respect to the center of the supply plate 310. For example, as shown in FIG. 5, the supply holes 312 may be formed in eight rows along the virtual concentric circle with respect to the center of the supply plate 310. When first to eighth rows are defined in order from the closest row to the supply plate center 311, the supply pipe in the first row may include 7 supply holes 312, the supply pipe in the second row may include 17 supply holes 312, the supply pipe in the third row may include 28 supply holes 312, the supply pipe in the fourth row may include 40 supply holes 312, the supply pipe in the fifth row may include 48 supply holes 312, the supply pipe in the sixth row may include 56 supply holes 312, the supply pipe in the seventh row may include 64 supply holes 312, and the supply pipe in the eighth row may include 72 supply holes 312. However, example embodiments are not limited thereto, and the supply holes 312 of the supply plate 310 may be formed in any of various arrangement structures.

The spray hole groups 322 of the plate 320 may be formed to correspond to each supply hole 312 of the supply plate 310. Referring to FIGS. 5 and 6, when the plate 320 and the supply plate 310 are coupled, spray hole groups 322_a may correspond to supply holes 312_a, spray hole groups 322_b may correspond to supply holes 312_b, and spray hole groups 322_c may correspond to supply holes 312_c, respectively. However, example embodiments are not limited to this arrangement. In addition, each of the spray hole groups 322 may include one or more spray holes. For example, as shown in FIG. 6, the spray hole groups 322_a may each include 3 spray holes, the spray hole groups 322_b may each include 1 spray hole, and the spray hole groups 322_c may each include 1 spray hole. The gas provided from the gas input 200 through the stacked structure of the showerhead 300 may gradually spread over a wide area as it passes through the gas branch pipe 220, the supply pipe 318, the supply holes 312, and the spray holes.

Figure 6:
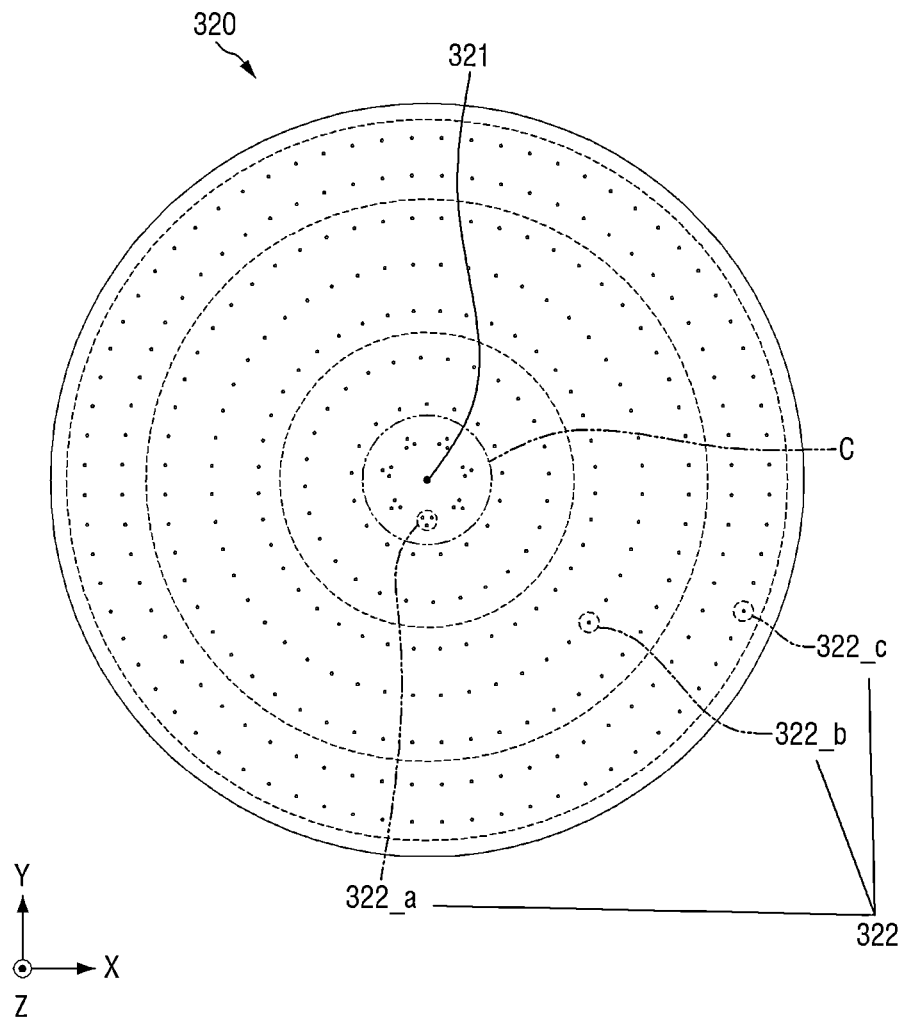
FIG. 6 is a view showing the plate from a direction B of FIG. 4.
Figure 7:
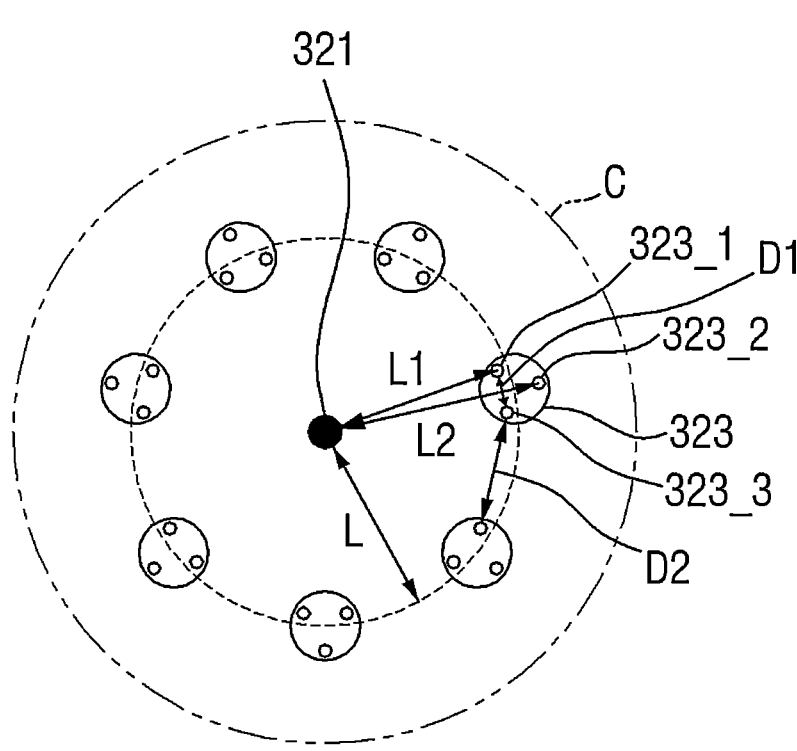
FIG. 7 is an enlarged view in which a region C of FIG. 6 is enlarged.

FIG. 7 is an enlarged view in which a region C of FIG. 6 is enlarged.

Referring to FIGS. 6 and 7, the number of spray hole groups 323 formed in a first row may be 7. In addition, the number of sub spray holes 323_1, 323_2 and 323_3 included in each spray hole group 323 may be 3. Although FIGS. 6 and 7 show example embodiments where the number of spray hole groups 323 is 7 and the number of sub spray holes included in each spray hole group 323 is 3, example embodiments are not limited thereto. For example, each spray hole group 323 may include a different number of sub spray holes. The distance D1 between one sub spray hole 323_3 and another sub spray hole 323_1 of a certain spray hole group 323 is smaller than the distance D2 between the sub spray hole 323_3 and any sub spray hole in another spray hole group adjacent to it. As a result, the spray hole group 323 may be defined.

A distance from the plate center 321 to the spray hole of the spray hole group 323 may be different for each spray hole. Referring to FIG. 7, L is an average value of the distances from the plate center 321 to each spray hole of the spray hole group 323. A distance L1 from the plate center 321 to the sub spray holes 323_1, 323_3 is smaller than a distance L2 from the plate center 321 to the sub spray hole 323_2. In some example embodiments, L1<L<L2 is established.

Among the spray holes of the spray hole group 323, the number of sub spray holes 323_1, 323_3 where the distance from the plate center 321 is smaller than L may be more than the number of sub spray holes 323_2 where the distance from the plate center 321 is greater than L. Referring to FIG. 7, the number of sub spray holes 323_1, 323_3 positioned at the distance L1 from the plate center 321 is 14, and the number of sub spray holes 323_2 positioned at the distance L2 from the plate center 321 is 7 (14>7). In other words, more spray holes included in the spray hole group 323 formed in the first row may be arranged in a portion relatively close to the plate center 321.

The reason for arranging the spray holes on the plate 320 as described above is as follows. In general, in the process of processing the semiconductor wafer inside the chamber, the gas may not be sufficiently supplied from the plate 320 to the central portion of the semiconductor wafer compared to other portions thereof. However, as in the present example embodiments, it is possible to supply more gas to the center portion of the plate 320 by arranging relatively more spray holes in the center portion of the plate 320. As described above, it is possible to improve the process uniformity of the semiconductor wafer by more uniformly supplying the gas to the semiconductor wafer as a whole.

Figure 8:
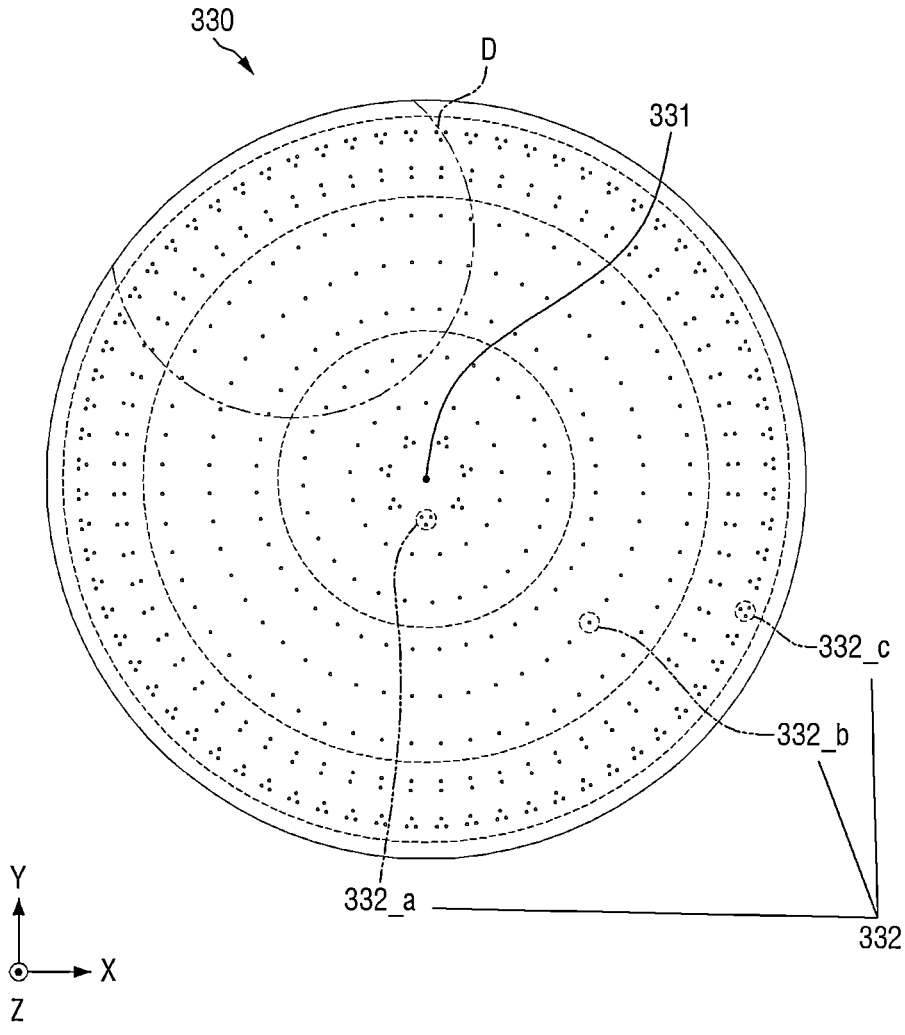
FIG. 8 is a view for describing a plate used in a semiconductor wafer processing device according to other example embodiments of the present disclosure.
Figure 9:
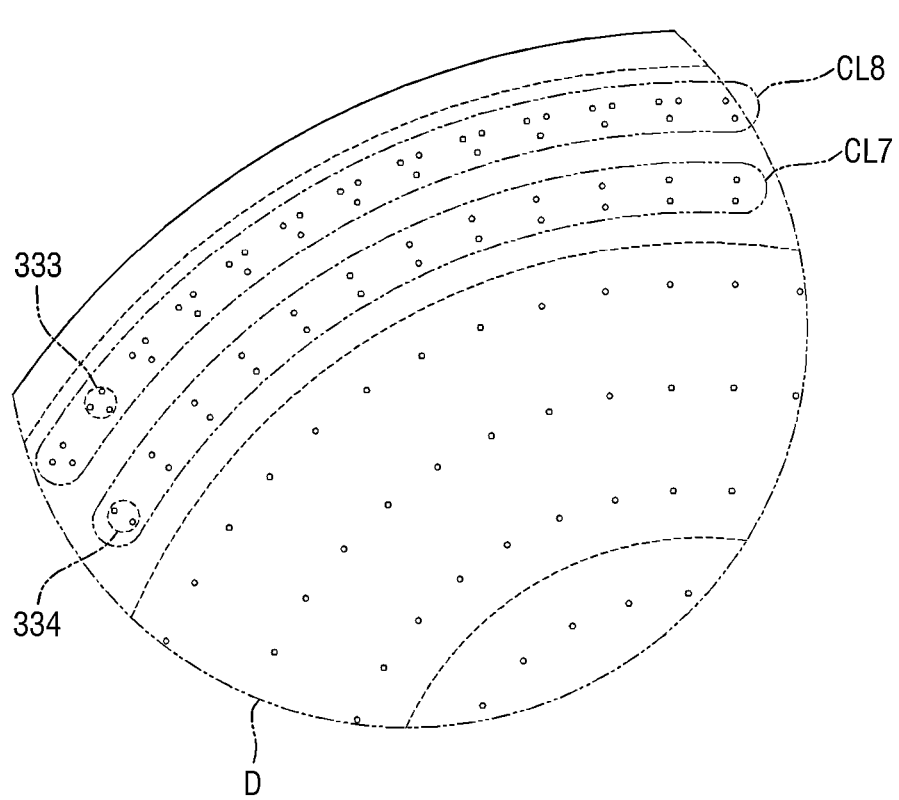
FIG. 9 is an enlarged view in which a region D of FIG. 8 is enlarged.

FIG. 8 is a view for describing a plate used in a semiconductor wafer processing device according to other example embodiments of the present disclosure. FIG. 9 is an enlarged view in which a region D of FIG. 8 is enlarged. Hereinafter, a difference from the plate of FIG. 6 will be mainly described.

Referring to FIGS. 5 and 8, a plate 330 may include a plate center 331, a fastening hole (not shown), an alignment hole (not shown), and/or spray hole groups 322. The supply plate center 311 may correspond to the plate center 331. The fastening hole (not shown) may be formed so that the plate 330 may be fixed to the supply plate 310 corresponding to each fastening hole (not shown) of the plate 330. Likewise, the alignment hole (not shown) may be formed so that the plate 330 may be accurately fixed to the supply plate 310 corresponding to each alignment hole (not shown) of the plate 330.

The spray hole groups 332 of the plate 330 may be formed to correspond to each supply hole 312 of the supply plate 310. When the plate 330 and the supply plate 310 are coupled, spray hole groups 332_a may correspond to the supply holes 312_a, spray hole groups 332_b may correspond to the supply holes 312_b, and spray hole groups 332_c may correspond to the supply holes 312_c. In addition, the spray hole groups 332 may each include one or more spray holes. For example, as shown in FIG. 8, the spray hole groups 332_a may each include 3 spray holes, the spray hole groups 332_b may each include 1 spray hole, and the spray hole groups 332_c may each include 3 spray holes.

The spray hole groups 332 formed in seventh and eighth rows of the plate 330 may correspond to the supply holes 312 in seventh and eighth rows of the supply plate 310.

FIG. 9 is an enlarged view in which a region D of FIG. 8 is enlarged.

The number of spray holes included in a spray hole group 333 formed in the eighth row CL8 may be more than the number of spray holes included in a spray hole group 334 formed in the seventh row CL7. In addition, referring to FIGS. 8 and 9, the number of spray holes included in the spray hole group 333 formed in the eighth row may be more than the number of spray holes included in the other spray hole groups formed in second to sixth rows.

For example, referring to FIG. 9, the number of spray holes included in each spray hole group 333 formed in the eighth row may be 3, and the number of spray holes included in each spray hole group 334 formed in the seventh row may be 2 (3>2). In addition, referring to FIG. 8, the number of spray holes included in the spray hole groups other than the spray hole groups formed in the first, seventh, and eighth rows may be 1 (3>2>1). In other words, except for the spray hole groups formed in the first row, the spray hole groups farther from the plate center 331 (the spray hole groups positioned closer to the edge of the plate 300) may include larger numbers of spray holes. However, example embodiments are not limited thereto, and each spray hole group of the plate 330 may include various numbers of spray holes.

The reason for arranging the spray holes on the plate 330 as described above is as follows. In general, in the process of processing the semiconductor wafer inside the chamber, the gas may not be sufficiently supplied to the edge portion of the semiconductor wafer compared to the other portions of the semiconductor wafer. However, as in the present example embodiments, it is possible to supplement the insufficient amount of gas supply by arranging relatively more spray holes in the center portion and edge portion of the plate 330, thereby improving the process uniformity of the semiconductor wafer.

Figure 10:
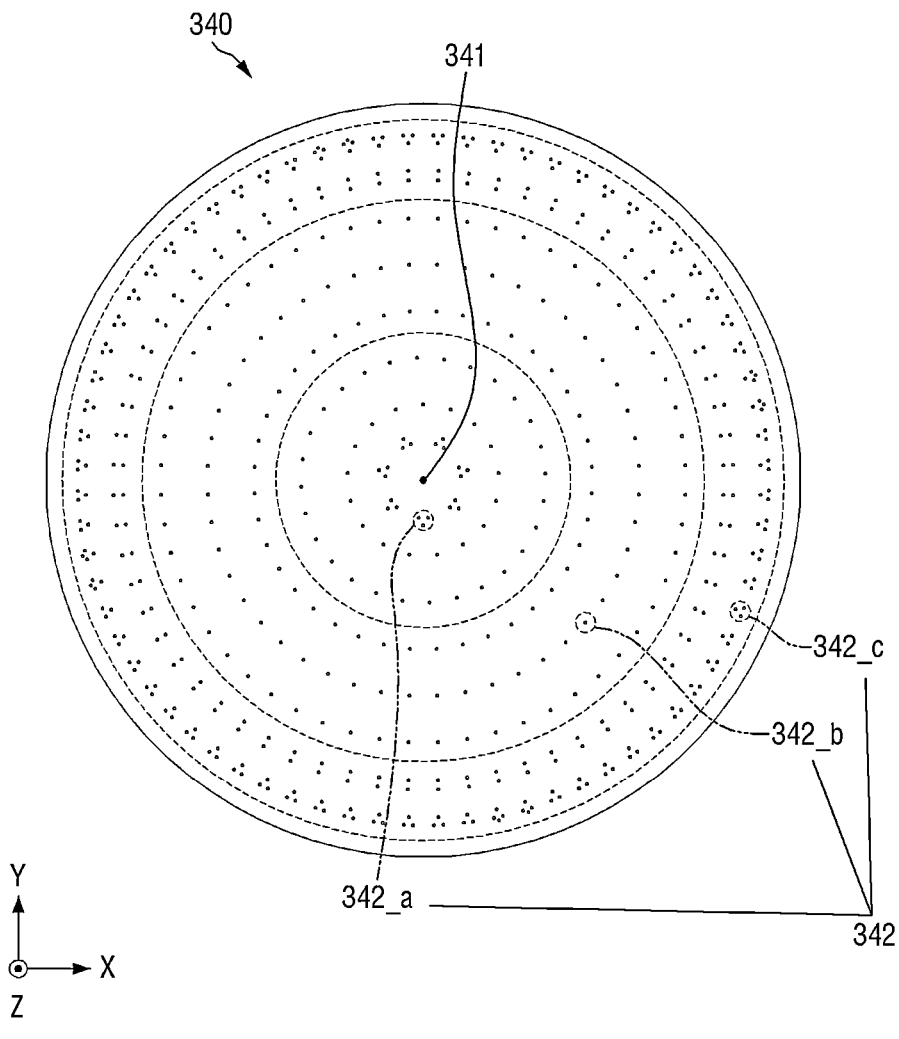
FIG. 10 is a view for describing a plate used in a semiconductor wafer processing device according to still other example embodiments of the present disclosure.
Figure 11:
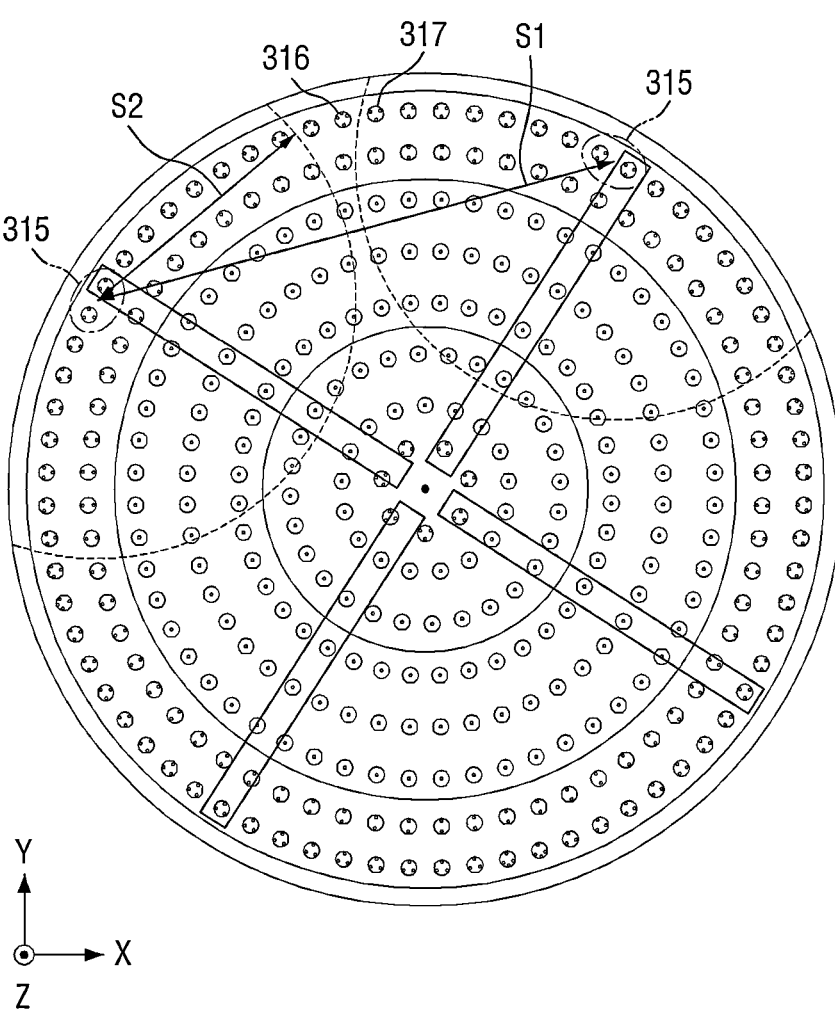
FIG. 11 is a perspective view showing the plate of FIG. 10 and the gas branch pipe of FIG. 3 at the same time in order to describe a configuration of the plate of FIG. 10.

FIG. 10 is a view for describing a plate 340 used in a semiconductor wafer processing device according to still other example embodiments of the present disclosure. FIG. 11 is a perspective view showing the plate of FIG. 10 and the gas branch pipe 220 of FIG. 3 at the same time in order to describe a configuration of the plate of FIG. 10. Hereinafter, a difference from the plate of FIG. 8 will be mainly described.

Referring to FIGS. 5, 10, and 11, a plate 340 may include a plate center 341, a fastening hole (not shown), an alignment hole (not shown), and/or spray hole groups 342. The supply plate center 311 may correspond to the plate center 341. The fastening hole (not shown) may be formed so that the plate 340 may be fixed to the supply plate 310 corresponding to each fastening hole (not shown) of the plate 340. Likewise, the alignment hole (not shown) may be formed so that the plate 340 may be accurately fixed to the supply plate 310 corresponding to each alignment hole (not shown) of the plate 320.

The spray hole groups 342 of the plate 340 may be formed to correspond to each supply hole 312 of the supply plate 310. When the plate 340 and the supply plate 310 are coupled, spray hole groups 342_a may correspond to the supply holes 312_a, spray hole groups 342_b may correspond to the supply holes 312_b, and spray hole groups 342_c may correspond to the supply holes 312_c. In addition, the spray hole groups 342 may each include one or more spray holes. The supply holes 312_c formed in the eighth row of the supply plate 310 may each correspond to the second spray hole groups 342_c formed in an eighth row of the plate 340.

Referring to FIG. 11, a hole (not shown) formed at the end of the gas branch pipe may be connected to the supply pipe in the eighth row to provide the gas to the supply holes 315. At this time, the supply holes formed in the eighth row of the supply plate 310 may each have a different distance to the midpoint between two supply holes 315 closest to the end of the gas branch pipe (which are the supply hole connected to the end of the gas branch pipe and the supply hole counterclockwise adjacent to the supply hole). In FIG. 11, 51 is a distance between the supply hole 315 closest to the end of one side of the gas branch pipe and the supply hole 315 closest to the end of the other side of the gas branch pipe adjacent to the end. The spray hole group corresponding to the supply hole 316 that is equal to or farther than a distance (S1)/2 from any one of the supply holes 315 of the plate 310 may include more spray holes than the spray hole group corresponding to a supply hole 317 formed within a distance S2, which is any one of the distances closer than the distance (S1)/2. For example, the spray hole group corresponding to the supply hole 316 may include 4 spray holes, and the spray hole group corresponding to the supply hole 317 may include 3 spray holes. However, the plate 340 shown in FIG. 10 is illustrative, and example embodiments are not limited thereto.

The reason for arranging the spray hole on the plate 340 as described above is as follows. When the gas is provided to the supply pipe of the supply plate 310 through the gas branch pipe 220, the supply hole 316 far from the hole where the gas branch pipe 220 and the supply pipe are connected may have a smaller amount of gas received from the gas branch pipe 220 than the supply hole 317 relatively close to the hole. In some example embodiments, finally, the gas may be ununiformly sprayed to the semiconductor wafer, thereby impairing the process uniformity of the semiconductor wafer. In some example embodiments, as in the present example embodiments, it is possible to more uniformly adjust the amount of gas sprayed to the semiconductor wafer by arranging relatively more spray holes in the portion far from the gas branch pipe, thereby improving the process uniformity of the semiconductor wafer.

Figure 12:
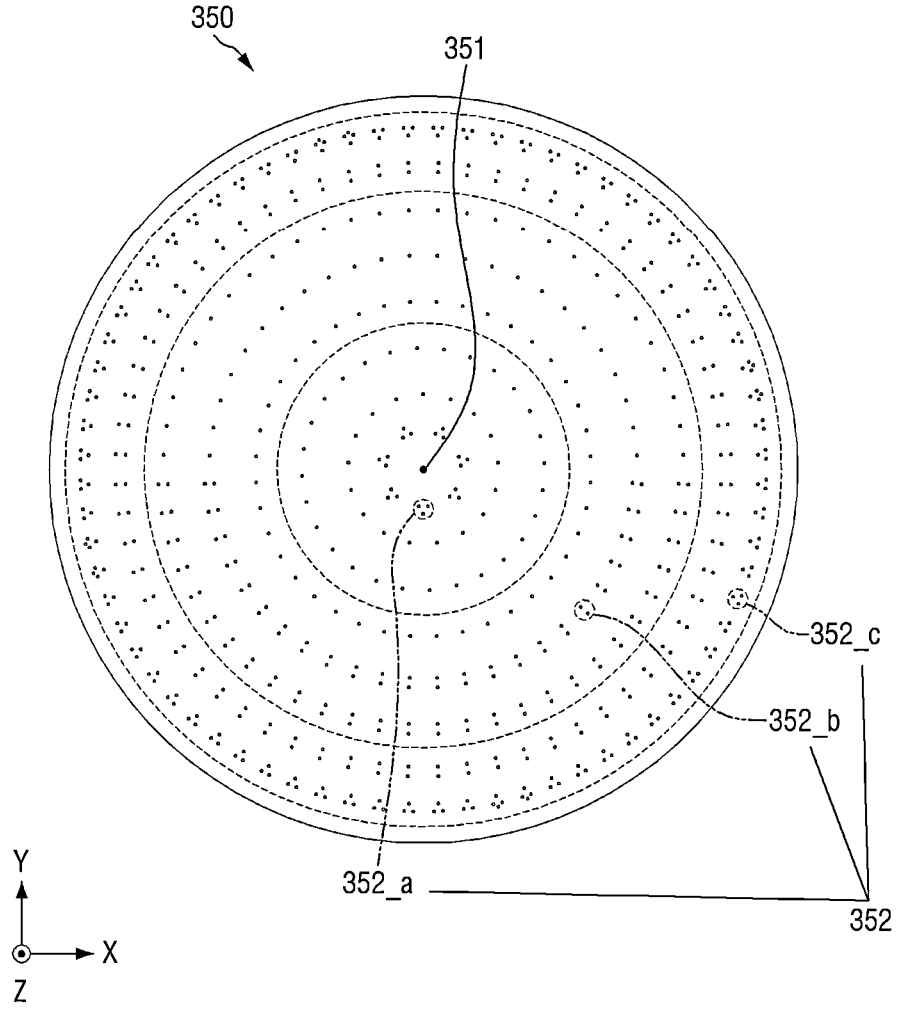
FIG. 12 is a view for describing a plate used in a semiconductor wafer processing device according to still other example embodiments of the present disclosure.
Figure 13:
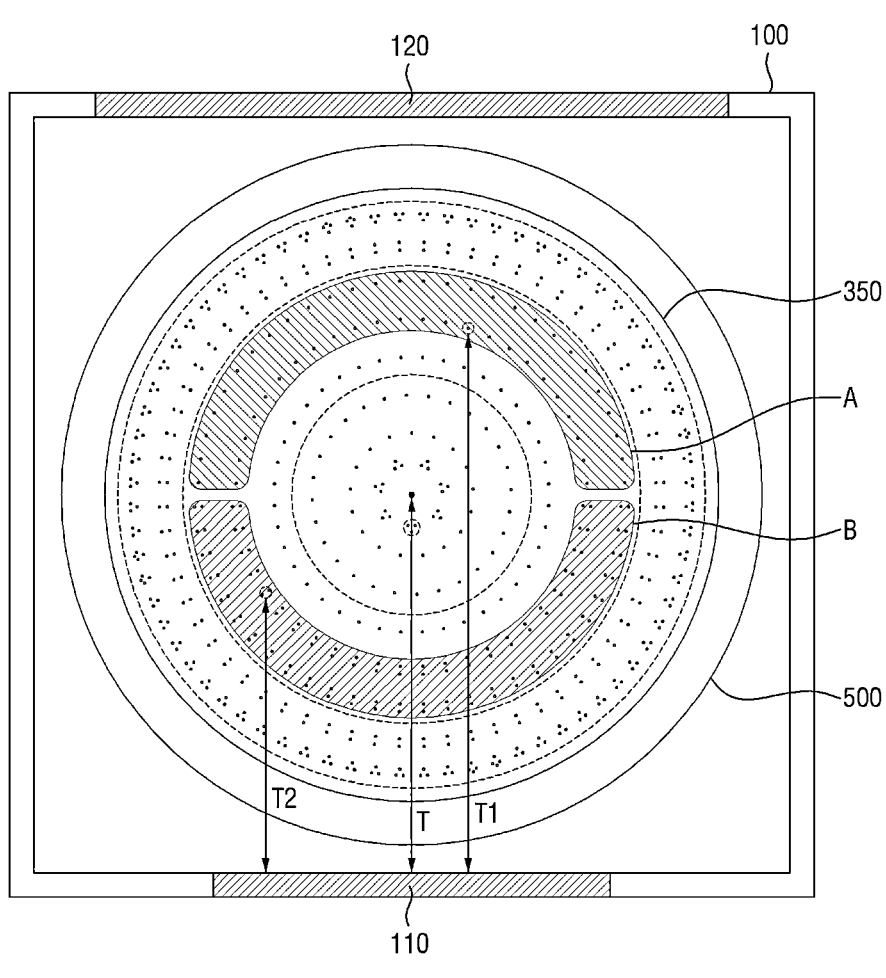
FIG. 13 is a cross-sectional view of a chamber for describing the plate of FIG. 12.
Figure 13:
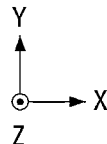
Figure 14:
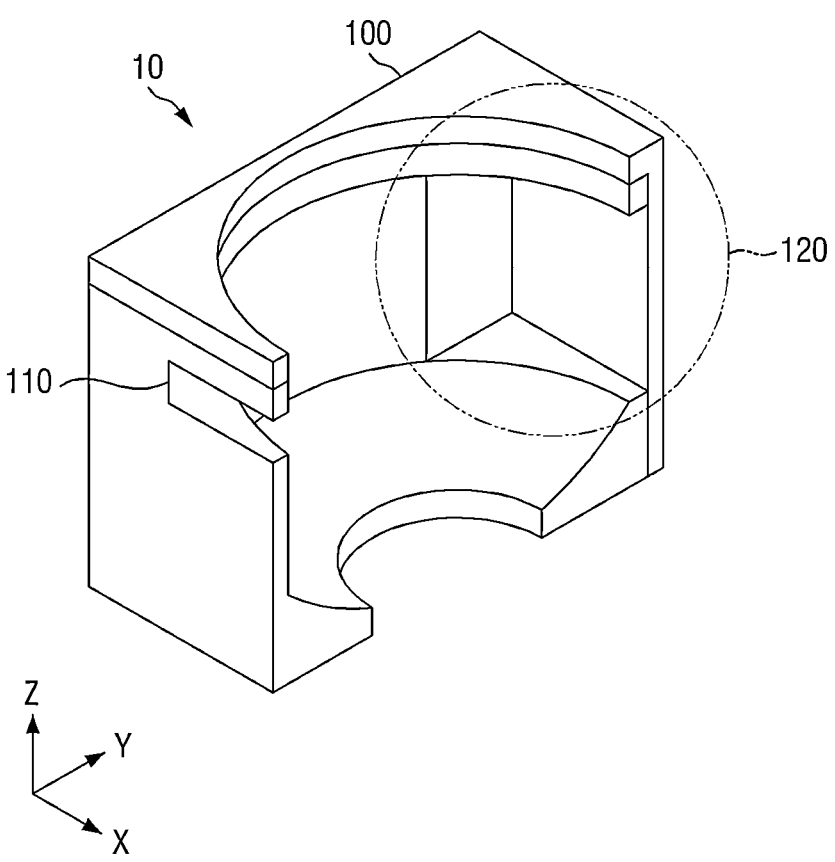
FIG. 14 is a structural view for describing a structure of the chamber of FIG. 13.

FIG. 12 is a view for describing a plate used in a semiconductor wafer processing device according to still other example embodiments of the present disclosure. FIG. 13 is a cross-sectional view of a chamber for describing the plate of FIG. 12. FIG. 14 is a structural view for describing a structure of the chamber of FIG. 13. Hereinafter, a difference from the plate of FIG. 10 will be mainly described.

Referring to FIGS. 5 and 12, a plate 350 may include a plate center 351, a fastening hole (not shown), an alignment hole (not shown), and/or spray hole groups 352. The supply plate center 311 may correspond to the plate center 351. The fastening hole (not shown) may be formed so that the plate 350 may be fixed to the supply plate 310 corresponding to each fastening hole (not shown) of the plate 350. Likewise, the alignment hole (not shown) may be formed so that the plate 350 may be accurately fixed to the supply plate 310 corresponding to each alignment hole (not shown) of the plate 350.

The spray hole groups 352 of the plate 350 may be formed to correspond to each supply hole 312 of the supply plate 310. When the plate 350 and the supply plate 310 are coupled, spray hole groups 352_a may correspond to the supply holes 312_a, spray hole groups 352_b may correspond to the supply holes 312_b, and spray hole groups 352_c may correspond to the supply holes 312_c. In addition, the spray hole groups 352 may each include one or more spray holes. For example, as shown in FIG. 12, the spray hole groups 352_a may each include 3 spray holes, the spray hole groups 352_b may each include 2 spray holes, and the spray hole groups 352_c may each include 3 spray holes.

Referring to FIGS. 12 and 13, a region including the spray hole groups formed in fifth and sixth rows on the plate 350 may be classified into a region A (A) and a region B (B). A y-directional distance T1 from the wafer inlet 110 to any one of the spray hole groups belonging to the region A is greater than a distance T from the wafer inlet 110 to the plate center 351. On the other hand, a y-directional distance T2 from the wafer inlet 110 to any one of the spray hole groups belonging to the region B is smaller than the distance T from the wafer inlet 110 to the plate center 351. In some example embodiments, the number of spray holes included in the spray hole group of the region B may be more than the number of spray holes included in the region A. For example, in FIG. 13, the number of spray holes included in each spray hole group of the region A is 1, and the number of spray holes included in each spray hole group of the region B is 2 (1<2). However, example embodiments are not limited thereto, and the number of spray holes included in the spray hole groups of the regions A and B may be variously changed.

The reason for arranging the spray holes on the plate 350 as described above is as follows. Referring to FIG. 14, since spaces occupied by the wafer inlet 110 and the cantilever 120 of the chamber 100 are different from each other, structural asymmetry may occur inside the chamber. Due to this structural asymmetry, the gas may not be sufficiently supplied to a portion of the semiconductor wafer close to the semiconductor wafer inlet 110 from the showerhead. In some example embodiments, as in the present example embodiments, it is possible to improve the process uniformity of the semiconductor wafer by arranging more spray holes in the portion (the region B of FIG. 13) of the plate 350 closer to the wafer inlet 110.

In concluding the detailed description, those skilled in the art will appreciate that many variations and modifications may be made to the preferred example embodiments without substantially departing from the principles of the present inventive concepts. Therefore, the disclosed preferred example embodiments of the inventive concepts are used in a generic and descriptive sense only and not for purposes of limitation.

What is claimed is:

1. A semiconductor wafer processing device comprising:
a chamber; and
a showerhead configured to supply a gas into the chamber, wherein the showerhead includes:
a plate further including a plurality of first spray hole groups in a first row that is an innermost row from a center of the plate, and a second spray hole group in a second row outside the first row, and
wherein
each first spray hole group of the plurality of first spray hole groups includes a plurality of first spray holes,
all of the plurality of first spray holes in the first row are evenly distributed in each first spray hole group,
within each first spray hole group, when L is an average value of distances from the center of the plate to each first spray hole of each of the plurality of first spray hole groups, a number of first spray holes at a distance L1 from the center of the plate smaller than L is more than a number of first spray holes at a distance L2 from the center of the plate greater than L, and a distance between two closest first spray holes in each first spray hole group that are at the distance L1 is less than a distance between two closest first spray holes of two immediately adjacent first spray hole groups.

2. The semiconductor wafer processing device of claim 1, wherein the showerhead further includes:

a supply plate on the plate and configured to receive the gas from a gas input to deliver the gas to the plate, the supply plate including a plurality of supply holes in rows to correspond to the plurality of first spray holes.

3. The semiconductor wafer processing device of claim 2, wherein the gas input includes:

a main supply pipe; and a plurality of branch pipes branched from the main supply pipe, wherein the gas is configured to be provided to the supply plate through a hole of a branch pipe of the plurality of branch pipes, the plurality of supply holes includes a first supply hole at a first distance from the hole of the branch pipe, and a second supply hole at a second distance farther than the first distance, and a number of spray holes of the second spray hole group corresponding to the first supply hole is less than the number of spray holes of the second spray hole group corresponding to the second supply hole.

4. The semiconductor wafer processing device of claim 1, wherein a total number of first spray holes in each first spray hole group includes the number of first spray holes at the distance L1 and the number of first spray holes at the distance L2, and the total number of first spray holes is more than a number of spray holes in each spray hole group in each row of a plurality of rows between the first row and the second row.

5. The semiconductor wafer processing device of claim 1, wherein a total number of spray holes in each second spray hole group is more than a total number of spray holes in each spray hole group in a plurality of rows between the first row and the second row.

6. The semiconductor wafer processing device of claim 5, wherein the showerhead includes a third spray hole group in a third row between the second row and the plurality of rows, wherein a total number of spray holes in each third spray hole group is less than the total number of spray holes in each second spray hole group and is more than the total number of spray holes in each spray hole group in the plurality of rows.

7. The semiconductor wafer processing device of claim 6, wherein the total number of spray holes of each of the first spray hole group and the second spray hole group is 3, and the total number of spray holes in each third spray hole group is 2.

8. The semiconductor wafer processing device of claim 1, wherein the chamber includes a wafer inlet, the showerhead includes a plurality of fourth spray hole groups in rows between the first row and the second row, each of the fourth spray hole groups includes a plurality of spray holes, M is a distance from the wafer inlet to the center of the plate, and a number of spray holes of each of the fourth spray hole groups where a distance from the wafer inlet toward the center of the plate is smaller than M is more than the number of spray holes of each of the fourth spray hole groups where the distance from the wafer inlet toward the center of the plate is greater than M.

9. A semiconductor wafer processing device comprising:

a chamber; and a showerhead configured to supply a gas into the chamber, wherein the showerhead includes:

a plate, the plate further including a plurality of first spray hole groups in a first row that is an innermost row from a center of the plate; and a plurality of second spray hole groups in a second row outside the first row, wherein each first spray hole group of the plurality of first spray hole groups includes a plurality of first spray holes, all first spray holes in the first row are evenly distributed in a corresponding one of the plurality of first spray hole groups, within each first spray hole group, a number of first spray holes at a first distance from the center of the plate is more than a number of first spray holes at a second distance farther than the first distance, and each of the second spray hole groups includes a plurality of second spray holes, and a number of second spray holes at a third distance from the center of the plate is less than a number of second spray holes at a fourth distance farther than the third distance.

10. The semiconductor wafer processing device of claim 9, wherein the number of spray holes of each of the first spray hole group and the second spray hole group is more than a number of spray holes of spray hole groups other than the first spray hole group and the second spray hole group.

* * * * *